United States Patent
Hartjes (10) Patent No.: US 9,846,375 B2
(45) Date of Patent: Dec. 19, 2017

(54) LITHOGRAPHY APPARATUS WITH SEGMENTED MIRROR

(71) Applicant: Carl Zeiss SMT GmbH, Oberkochen (DE)

(72) Inventor: Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 403 days.

(21) Appl. No.: 14/573,058

(22) Filed: Dec. 17, 2014

(65) Prior Publication Data

US 2015/0103327 A1    Apr. 16, 2015

Related U.S. Application Data

(63) Continuation of application No. PCT/EP2013/062735, filed on Jun. 19, 2013.
(Continued)

(30) Foreign Application Priority Data

Jul. 11, 2012 (DE) ........................ 10 2012 212 064

(51) Int. Cl.
    *G03B 27/54* (2006.01)
    *G03B 27/72* (2006.01)
    (Continued)

(52) U.S. Cl.
    CPC ............ *G03F 7/7085* (2013.01); *G01L 21/22* (2013.01); *G03F 7/702* (2013.01);
    (Continued)

(58) Field of Classification Search
    CPC .. G01B 13/12; G01B 7/14; G01B 7/15; G01L 21/22; G03F 7/702; G03F 7/70091; G03F 7/70125; G03F 7/70133; G03F 7/70141; G03F 7/7015; G03F 7/70233; G03F 7/70258; G03F 7/70316; G03F 7/70591;
    (Continued)

(56) References Cited

U.S. PATENT DOCUMENTS

| 4,816,759 A | 3/1989 | Ames et al. |
| 4,825,062 A | 4/1989 | Rather et al. |

(Continued)

FOREIGN PATENT DOCUMENTS

| CN | 1684002 A | 10/2005 |
| CN | 102265216 A | 11/2011 |

(Continued)

OTHER PUBLICATIONS

Chinese Office Action, with translation thereof, for CN Appl No. 201380036437.4, dated Sep. 18, 2015.
(Continued)

*Primary Examiner* — Christina Riddle
(74) *Attorney, Agent, or Firm* — Fish & Richardson P.C.

(57) ABSTRACT

A lithography apparatus is disclosed, which comprises a mirror having at least two mirror segments which are joined together in such a way that an interspace is formed between the mirror segments, and a sensor for detecting the relative position of the mirror segments, wherein the sensor is arranged in the interspace between the mirror segments.

17 Claims, 6 Drawing Sheets

Related U.S. Application Data (60) Provisional application No. 61/670,215, filed on Jul. 11, 2012.

(51) Int. Cl.
    *G03F 7/20*     (2006.01)
    *G01L 21/22*     (2006.01)
    *G01B 13/12*     (2006.01)
    *G01B 7/14*     (2006.01)

(52) U.S. Cl.
    CPC ...... *G03F 7/70233* (2013.01); *G03F 7/70591* (2013.01); *G01B 7/14* (2013.01); *G01B 13/12* (2013.01)

(58) Field of Classification Search
    CPC .... G03F 7/7085; G03F 7/709; G03F 7/70933; G03F 7/70975
    USPC ............ 355/30, 52, 53, 55, 67–71, 77; 250/492.1, 492.2, 492.22, 192.23, 493.1, 250/504 R, 548; 359/201.1, 201.2, 216.1, 359/217.3, 850, 845, 846–849, 851, 359/854–855, 865, 866, 871; 356/614, 356/615, 625, 626–627, 634, 635
    See application file for complete search history.

(56) References Cited

U.S. PATENT DOCUMENTS

| | | | |
|---|---|---|---|
| 5,109,349 A | | 4/1992 | Ulich et al. |
| 7,050,161 B1* | | 5/2006 | Rakoczy ............ G02B 26/0816 356/125 |
| 2004/0227107 A1* | | 11/2004 | Cox ................... G03F 7/70141 250/548 |
| 2004/0227915 A1 | | 11/2004 | Ohtsuka |
| 2005/0190353 A1 | | 9/2005 | Gui et al. |
| 2008/0049203 A1 | | 2/2008 | Mishima |
| 2009/0033904 A1* | | 2/2009 | Kawashima ........ G03F 7/70225 355/67 |
| 2010/0110390 A1 | | 5/2010 | Andersen et al. |
| 2011/0001947 A1* | | 1/2011 | Dinger ................... G02B 26/06 355/67 |
| 2011/0273694 A1 | | 11/2011 | Werber et al. |

FOREIGN PATENT DOCUMENTS

| | | |
|---|---|---|
| EP | 1 569 035 A1 | 8/2005 |
| JP | H 03-226708 A | 10/1991 |
| JP | 10-154654 A | 6/1998 |
| JP | 2004-266264 A | 9/2004 |
| JP | 2005-244238 A | 9/2005 |
| JP | 2011-512659 A | 4/2011 |
| TW | 200830062 A | 7/2008 |
| WO | WO 02/04911 A1 | 1/2002 |
| WO | WO 2009/100856 A1 | 8/2009 |
| WO | WO 2012/059537 | 5/2012 |

OTHER PUBLICATIONS

Japanese Office Action, with translation thereof, for JP Appl No. 2015-520878, dated Nov. 16, 2015.
Chinese Office Action, with translation thereof, for CN Appl No. 201380036437.4, dated Oct. 11, 2016.
Korean Office Action, with translation thereof, for KR Appl No. 10-2015-7000288, dated Nov. 9, 2016.
Korean Office Action, with translation thereof, for KR Appl No. 10-2015-7000288, dated Mar. 14, 2016.
Chinese Office Action, with translation thereof, for CN Appl No. 201380036437.4, dated Jun. 24, 2016.
Dr.-Ing. Karla Hiller, "Technologieentwicklung für kapazitive Sensoren mit bewegten Komponenten" ["Technological development for capacitive sensors with moving components"], TU Chemnitz, 2004, in particular Section 4.1, pp. 70-74.
International Search Report and Written Opinion for corresponding PCT Appl No. PCT/EP2013/062735, dated Oct. 21, 2013.

* cited by examiner

LITHOGRAPHY APPARATUS WITH SEGMENTED MIRROR

CROSS-REFERENCE TO RELATED APPLICATIONS

The present application is a continuation of, and claims priority under 35 USC 120 to, international application PCT/EP2013/062735, filed Jun. 19, 2013, which claims benefit under 35 USC 119 of German patent application DE 10 2012 212 064.5, (filed on Jul. 11, 2012. International application PCT/EP2013/062735 also claims priority under 35 USC 119(e) to U.S. patent application 61/670,215, filed on Jul. 11, 2012. The entire disclosure of each of these applications is incorporated by reference herein.

FIELD OF THE INVENTION

The invention relates to a lithography apparatus comprising one or more segmented mirrors.

RELATED ART

Lithography apparatuses are used for example in the production of integrated circuits or ICs in order to image a mask pattern in a mask onto a substrate, such as e.g. a silicon wafer. To this end, a light beam generated by an illumination device is directed through the mask onto the substrate. An exposure lens consisting of a plurality of optical elements serves for focusing the light beam on the substrate. Examples of such lithography apparatuses are, in particular, EUV (Extreme Ultra Violet) lithography apparatuses, which operate with optical wavelengths for the exposure in the range of 4 nm to 30 nm. Such short wavelengths make it possible to image extremely small structures on the wafer. Since light in this wavelength range is absorbed by atmospheric gases, the beam path of such EUV lithography apparatuses is situated in a high vacuum. Furthermore, there is no material which is sufficiently transparent in the wavelength range mentioned, for which reason mirrors are used as optical elements for shaping and guiding the EUV radiation.

EUV lithography apparatuses having a large numerical aperture require mirrors having a large diameter. Thus, diameters of 300 to 500 mm or more are required for mirrors in proximity to the wafer. However, mirrors having such a large diameter are costly to produce. Furthermore, the availability of blanks or semi-finished parts for such sizes is encountering its limits. Moreover, with large mirror diameters, low-deformation mounting and actuation is also made more difficult. One possibility for combating this problem is to use segmented mirrors. In this case, a plurality of mirror segments are joined together to form a mirror. Consequently, the size of the mirror is no longer limited by the availability of blanks. Furthermore, low-deformation mounting of a plurality of individual mirror segments is also simpler than the low-deformation mounting of an integral mirror having a large diameter.

One difficulty which arises in this case, however, is that of precisely joining together the finished polished mirror segments. Since the different mirror segments together are intended to produce a single optical surface, the surface deviation, that is to say the difference in height between the mirror segments, should not be more than 20 nm, but this proves to be difficult. In this case, it is necessary to determine the positions of all the mirror segments with respect to all six degrees of freedom (three translational and three rotational), and if appropriate to readjust them via actuators. This means that, for example in the case of four mirror segments, a total of 24 sensors have to be provided, which entails a considerable outlay and space requirement.

The U.S. patent application 2011/0273694 A1 discloses a facet mirror composed of a multiplicity of individual mirrors, wherein the individual mirrors are individually drivable and have capacitive sensors for detecting their orientation.

It is therefore an object of the present invention to provide a lithography apparatus comprising a mirror arrangement with which at least one of the problems mentioned above is solved. In particular, it is an object of the present invention to provide a lithography apparatus comprising a segmented mirror arrangement which enables space-saving and precise regulation of the positions of the mirror segments.

This object is achieved via a lithography apparatus, comprising a mirror having at least two (e.g. two to twelve) mirror segments which are joined together in such a way that an interspace is formed between the mirror segments, and a sensor for detecting the relative position of the mirror segments, wherein the sensor is arranged in the interspace.

Arranging the sensor in the interspace between the mirror segments enables the relative positions of the mirror segments to be detected and regulated in a particularly space-saving manner. Consequently, it is no longer necessary to provide a plurality of sensors for each of the mirror segments outside the mirror. In order to detect the absolute position of the individual mirror segments, it suffices if the absolute position of a reference mirror segment is known, e.g. because the latter is detected by external sensors or because the latter is fixed relative to a reference point. The position of the other mirror segments can then be detected with the aid of sensors arranged between the mirror segments. Such a referencing makes it possible to detect so-called common-mode errors, that is to say positional errors that are common to all the mirror segments.

Furthermore, arranging the sensors in the interspace enables an in-situ measurement and thus a very precise measurement of the relative position of the mirror segments. The position of the individual mirror segments can be readjusted on the basis of the measurement results, wherein at the same time a calibration can be effected on the basis of an interferometric surface measurement of the mirror.

The mirror segments can each have at least one joining surface along which the mirror segments are joined together. Furthermore, a cutout can be provided in at least one of the joining surfaces, the sensor being arranged in the cutout. This makes it possible to design the distance between the mirror segments to be even smaller, since the sensor can be arranged in a manner recessed in the cutout. Via a small distance between the mirror segments, it is possible to achieve a virtually complete mirror surface having only small gaps, which improves the imaging properties of the mirror. In this case, "joining together" does not necessarily mean that the mirror segments are in contact with one another. Rather, it is advantageous if the mirror segments are arranged in a manner free of contact with respect to one another. In this case, the joining surfaces are the surfaces of the mirror segments which are arranged opposite one another at a small distance from one another.

The sensor can be a capacitive sensor which generates a sensor signal dependent on the distance between the mirror segments. Such a capacitive sensor can be realized for example by metal electrodes situated opposite one another on the joining surfaces of the mirror segments. In this case, the metal electrodes can be embodied as thin metal layers, such that a small distance between the mirror segments is made possible even without the sensor being recessed in the joining surface.

Furthermore, the sensor can also be embodied as an optical sensor. Optical sensors have a good drift behavior.

The optical sensor can be embodied as an optical encoder, in particular as an interference-based incremental encoder. A measurement accuracy into the picometers range can be achieved with such an encoder.

The lithography apparatus can furthermore comprise a sensor controller for driving the sensor and/or evaluating a sensor signal, wherein signals are transmitted wirelessly at least in sections between the sensor controller and the sensor. Thus, firstly a space saving is achieved, and secondly it is possible to avoid vapors from cables for signal transmission which impair the vacuum.

The sensor can also be a pressure sensor which generates a sensor signal dependent on the pressure in the interspace, wherein the interspace is configured in such a way that a relative movement of the mirror segments brings about a pressure change in the interspace. With such a pressure sensor, it is possible to achieve a good linearity of the sensor signal relative to changes in the position of the mirror segments.

The lithography apparatus can furthermore comprise a gas supply device for supplying a gas into the interspace, and a gas extraction device for extracting the gas from the interspace. With such an arrangement, the gas is primarily or exclusively passed through the interspace, which enables a use under vacuum conditions, such as is necessary in particular for EUV lithography apparatuses.

The pressure sensor can comprise for example a tuning fork and an arrangement for detecting the resonant frequency of the tuning fork and/or the vibration amplitude at the resonant frequency. In this case, the tuning fork can have two vibrating elements which can be caused to vibrate by excitation, wherein the resonant frequency of the tuning fork and/or the vibration amplitude at the resonant frequency are/is dependent on the pressure in the interspace. This is the case in particular when the width of the gap between the vibrating elements is smaller than the thickness of the vibrating elements by one or more orders of magnitude and the so-called squeeze effect occurs. Such a pressure sensor can be manufactured by microstructure engineering and can be designed to be correspondingly flat. In this case, the vibrating elements can be manufactured from structured semiconductor material or quartz. The pressure sensor can furthermore comprise electrodes which can be used to cause the vibrating elements to vibrate and which can be used to detect the resonant frequency of the tuning fork and/or the vibration amplitude at the resonant frequency.

In the simplest embodiment, the interspace between the mirror segments is a gap, wherein the sensor is arranged in the gap. In this case, the joining surfaces do not have to be subjected to any special structuring for receiving the sensor. As an alternative thereto, the interspace can comprise a channel, in which the sensor is arranged. Such a channel can be formed by an, in particular rectangular, groove in at least one joining surface of one of the mirror segments. In this case, the groove can extend over the entire length of the joining surface. Such a groove can be produced comparatively simply by milling using a diamond milling unit or the like.

It is also possible for a plurality of sensors for detecting the relative position of the mirror segments with respect to a plurality of degrees of freedom to be provided in the interspace. In this case, the sensors provided in the interspace can detect the position of the mirror segments for example with respect to three translational and three rotational degrees of freedom.

Furthermore, the lithography apparatus can comprise at least two actuators for separately actuating the individual mirror segments. Consequently, the position of the mirror segments can be regulated independently of one another.

Further exemplary embodiments will be explained with reference to the accompanying drawings.

BRIEF DESCRIPTION OF THE DRAWINGS

Unless indicated otherwise, identical reference signs in the figures designate identical or functionally identical elements. Furthermore, it should be noted that the illustrations in the figures are not necessarily true to scale.

EMBODIMENTS OF THE INVENTION

Figure 1:
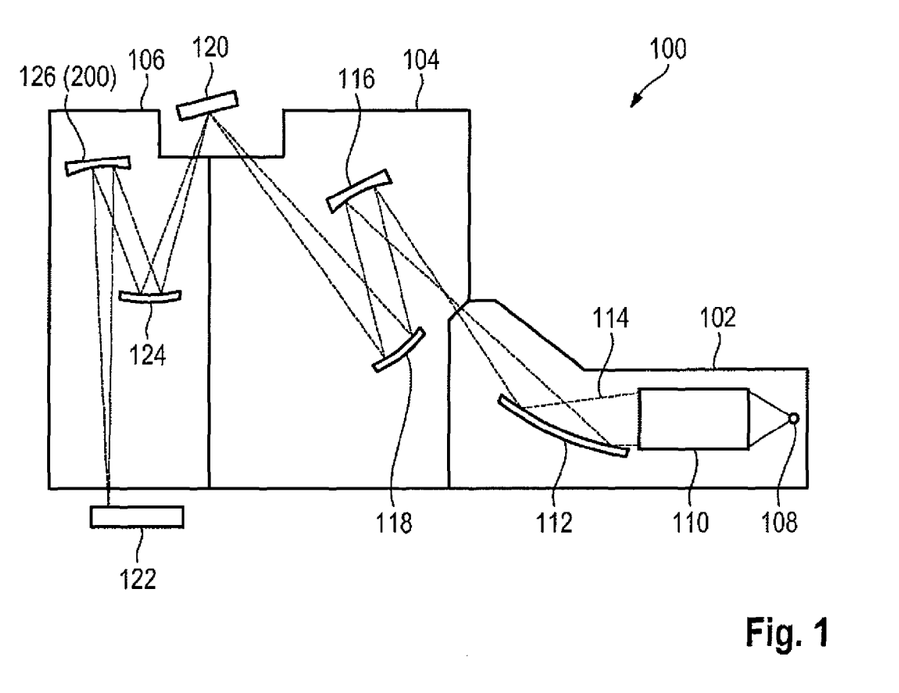
FIG. 1 shows a schematic view of an EUV lithography apparatus in accordance with one embodiment.

FIG. 1 shows a schematic view of an EUV lithography apparatus 100 in accordance with one embodiment, which comprises a beam shaping system 102, an illumination system 104 and a projection system 106. The beam shaping system 102, the illumination system 104 and the projection system 106 are in each case provided in a vacuum housing which can be evacuated with the aid of an evacuation device (not illustrated in greater detail). The vacuum housings are surrounded by a machine room (not illustrated in greater detail) in which e.g. the drive devices for mechanically moving and/or adjusting the optical elements are provided. Furthermore, electrical controllers and the like can also be provided in the machine room.

The beam shaping system 102 comprises an EUV light source 108, a collimator 110 and a monochromator 112. As EUV light source 108, it is possible to provide a plasma source or a synchrotron, for example, which emit radiation in the EUV range (extreme ultraviolet range), that is to say e.g. in the wavelength range of 5 nm to 20 nm. The radiation emerging from the EUV light source 108 is firstly focused by the collimator 110, after which the desired operating wavelength is filtered out by the monochromator 112. Consequently, the beam shaping system 102 adapts the wavelength and the spatial distribution of the light emitted by the EUV light source 108. The EUV radiation 114 generated by the EUV light source 108 has a relatively low transmissivity through air, for which reason the beam shaping spaces in the beam shaping system 102, in the illumination system 104 and in the projection system 106 are evacuated.

In the example illustrated, the illumination system 104 comprises a first mirror 116 and a second mirror 118. These mirrors 116, 118 can be embodied for example as facet mirrors for pupil shaping and direct the EUV radiation 114 onto a photomask 120.

The photomask 120 is likewise embodied as a reflective optical element and can be arranged outside the systems 102, 104, 106. The photomask 120 has a structure which is imaged onto a wafer 122 or the like in a demagnified manner via the projection system 106. For this purpose, the projection system in the beam guiding space 106 comprises for example a third mirror 124 and a fourth mirror 126. It should be noted that the number of mirrors of the EUV lithography apparatus 100 is not restricted to the number illustrated, and more or fewer mirrors can also be provided. Furthermore, the mirrors are generally curved at their front side for the purpose of beam shaping.

Figure 2:
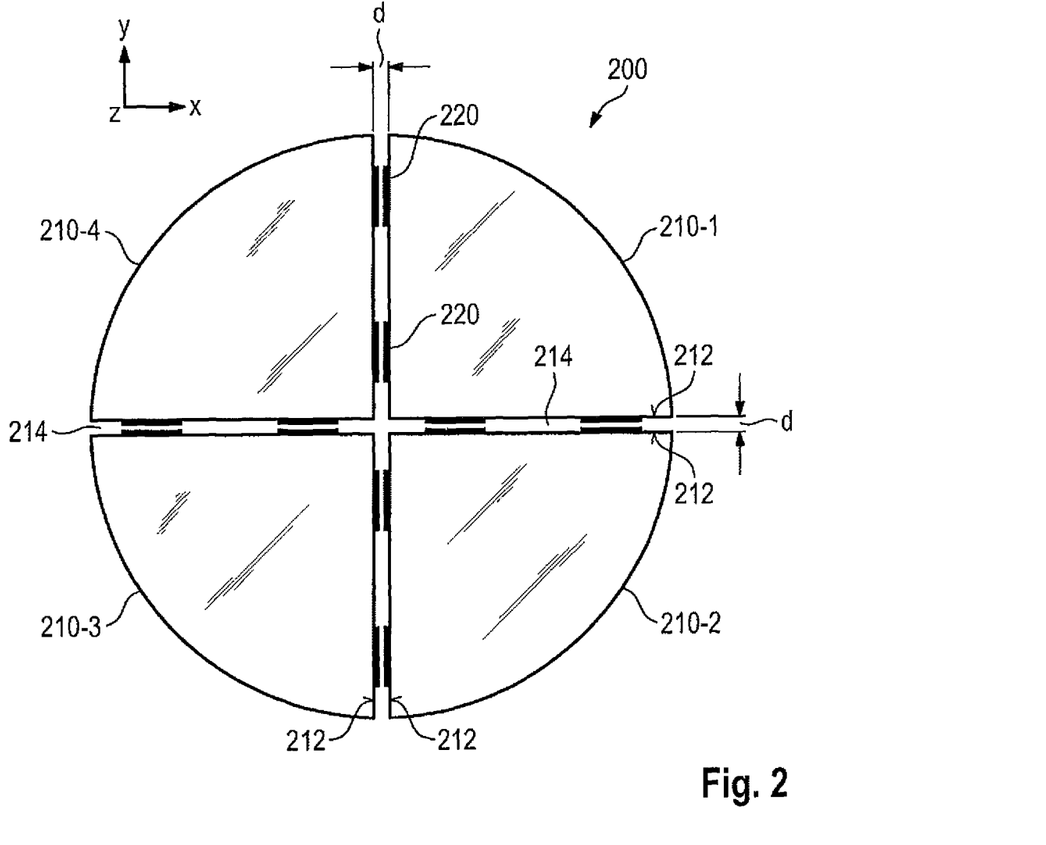
FIG. 2 is a schematic illustration of a mirror arrangement in accordance with one embodiment.

FIG. 2 is a schematic illustration of a mirror arrangement 200 in accordance with one embodiment, which corresponds for example to the mirror 126 in FIG. 1. The mirror arrangement 200 comprises for example four mirror segments 210, namely the mirror segments 210-1, 210-2, 210-3 and 210-4. In plan view the mirror segments 210 each have the form of a quarter circle. The mirror segments 210 are joined together along their joining surfaces 212, such that together they produce a segmented mirror surface having a defined geometry. The reflective surface of the mirror segments 210 is curved, and in the example illustrated the mirror segments 210 together form a concave mirror for focusing an incident EUV light beam onto the wafer 122, cf. FIG. 1. Generally, the arrangement described here can be applied to mirrors of all sizes. However, a segmentation of the mirror is particularly advantageous in the case of mirrors having large diameters, that is to say in the case of mirrors whose maximum diameter is e.g. greater than 30 cm or greater than 40 cm and is up to 100 cm or even more. Depending on the size of the mirror, the total height of the mirror arrangement can be 3 to 20 cm, for example. In the example illustrated, the mirror arrangement 200 is circular; however, the mirror arrangement is, of course, not restricted to this shape and can also be elliptical, oval, kidney-shaped or the like.

The mirror segments 210-1, 210-2, 210-3 and 210-4 are mounted independently of one another and do not touch one another. Accordingly, they are actuated independently of one another by actuators (not illustrated in greater detail), as will be explained in greater detail below. Interspaces 214 are provided between the adjacent mirror segments 210-1, 210-2, 210-3 and 210-4. In one possible variant, the interspaces 214 are formed by gaps, wherein the gaps have a gap width d.

Sensors 220 are arranged in the interspaces 214. The sensors 220 measure the relative position of the mirror segments 210-1, 210-2, 210-3 and 210-4 with respect to one another. In this case, it is possible for the sensors 220 to detect the relative position of the mirror segments 210-1, 210-2, 210-3 and 210-4 with respect to one another with respect to all six degrees of freedom, that is to say with respect to their relative position on the three spatial axes x, y and z, and also their relative orientation with respect to rotations about the three spatial axes x, y and z. To put it more precisely, each of the sensors 220 generates a sensor signal containing information about the relative position of two of the mirror segments 210 with respect to one another with respect to at least one degree of freedom. If all six degrees of freedom are detected, then at least 18 sensors 220 are thus provided in the interspaces 214, e.g. six sensors 220 for detecting the relative position of the mirror segment 210-1 with respect to the mirror segment 210-2, six sensors 220 for detecting the relative position of the mirror segment 210-2 with respect to the mirror segment 210-3, and six sensors 220 for detecting the relative position of the mirror segment 210-3 with respect to the mirror segment 210-4. However, it is also possible that not all degrees of freedom are covered by the sensors 220 provided in the interspaces 214. By way of example, it is possible that the sensors 220 only detect the relative position of the mirror segments 210 with respect to the direction transversely with respect to the interspace 214, and the remaining parameters are detected by sensors arranged outside the mirror arrangement 200. In this case, therefore, the sensors 220 detect for example the relative position of the mirror segments 210-1 and 210-4 and also the relative position of the mirror segments 210-2 and 210-3 in the x-direction, and the relative position of the mirror segments 210-1 and 210-2 and also the relative position of the mirror segments 210-3 and 210-4 in the y-direction.

Furthermore, it is possible to provide outside the mirror arrangement 200 sensors which determine the position of at least one of the mirror segments 210 for all six degrees of freedom with respect to a measurement frame (not illustrated in greater detail) provided in the lithography apparatus 100. Such a measurement frame can serve as a reference for the detection of the position of optical elements in the lithography apparatus, and is, in particular, positionally fixed relative to temperature changes, vibrations and the like. The position measurement for such a reference mirror segment 210 relative to the measurement frame can be effected via laser interferometers, capacitive sensors or the like. If, via a position measurement for one of the mirror segments 210, for example for the mirror segment 210-1, the position of the mirror segment 210 with respect to the measurement frame is determined, then the position of each individual one of the remaining mirror segments 210, that is to say of the mirror segments 210-2, 210-3 and 210-4, can also be deduced with the measurement values of the sensors 220.

The sensor signals generated by the sensors 220 are fed to an evaluation device (sensor controller or the like) (not illustrated in greater detail) which evaluates the sensor signals. At least in sections, signals can in this case be transmitted wirelessly between the sensor and the evaluation device or sensor controller. By way of example, the signals can be transmitted as radio signals (electromagnetic waves) or as light signals. This has the advantage that the number of cables that are led through the vacuum region of the apparatus can be reduced. Thus, firstly a space saving is achieved, and secondly it is possible to avoid vapors from such cables which impair the vacuum.

Depending on the evaluation result, the abovementioned actuators are driven in order to regulate the relative position of the mirror segments 210 to a specific desired value. By way of example, the mirror segments 210 can be actuated such that the maximum width d of the interspace 214 between the mirror segments 210 is not greater than 0.8 mm, preferably not greater than 0.4 mm or even not greater than 0.2 mm, and/or the surface deviation, that is to say the difference in height between the mirror segments 210, is not more than 20 nm, preferably not more than 10 nm.

Since the mirror arrangement 200 of the lithography apparatus 100 is segmented into four mirror segments 210, the mirror arrangement 200 can be provided with a larger optical surface than a monolithic mirror arrangement 200. Furthermore, the arrangement of the sensors 220 in the interspace 214 enables a space-saving detection and regulation of the positions of the mirror segments 210 with respect to one another.

Figure 3:
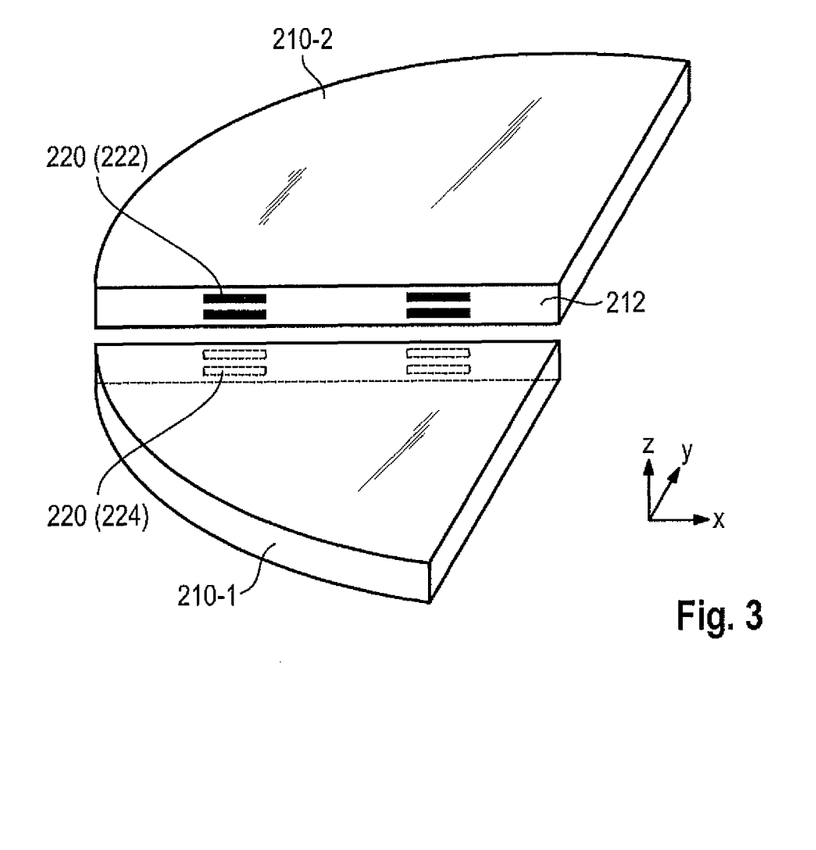
FIG. 3 schematically shows two of the mirror segments in an exploded perspective illustration.

FIG. 3 schematically shows the mirror segments 210-1 and 210-2 in an exploded perspective illustration. It should be noted that the surface of the mirror segments 210 is curved, and so the four mirror segments 210 together form a concave mirror. Correspondingly, the upper edge of the joining surface 212 is also curved, but this is not illustrated in the figures for the sake of simplicity. The lower edge of the joining surface 212 can be straight, or follow the course of the curved upper edge, that is to say e.g. run parallel thereto. As illustrated in FIG. 3, the mirror segments 210 each have a joining surface 212 at their straight sides, and the joining surfaces 212 of the mirror segments 210 are arranged opposite one another. The sensors 220 are arranged in or on the joining surfaces 212. In the example illustrated, four sensors 220 are arranged on the mutually opposite joining surfaces 212 of the mirror segments 210-1 and 210-2, which sensors can be used to detect the relative position of the mirror segments 210-1 and 210-2 with respect to one or more degrees of freedom. In this case, the sensors can be embodied as surface sensors, which substantially respond to a change in the position of the mirror segments with respect to one degree of freedom, or embodied as integrated sensors, which respond to a change in the position of the mirror segments with respect to a plurality of degrees of freedom.

As sensors 220, in principle it is possible to use all types of sensors which can be used to detect displacements of the sensor segments 210 with respect to one another, in particular capacitive sensors. Optical sensors are generally possible as well; by way of example, a line pattern can be provided on a joining surface 212 and photosensors for detecting the line pattern can be provided on the opposite joining surface 212. However, in the case of such optical encoder sensors, in general a certain evolution of heat occurs, which can influence the mirror geometry and can possibly necessitate cooling measures. The optical sensor can also be embodied as an interference-based incremental encoder. Such an encoder comprises an interferometer that is moved relative to a linear grating. In this case, a sinusoidal signal is generated e.g. from the optical reflections at a line pattern or grating. Via interpolation, it is possible to obtain a very high resolution which enables a measurement accuracy in the picometers range. The signal transmission between the encoder and the evaluation device or sensor controller can be effected wirelessly, as already mentioned above. Furthermore, it is possible for the cables for driving the sensor to be led toward the outside in grooves provided in the mirror. For this purpose, the grooves explained in even greater detail below can also be used.

Figure 4:
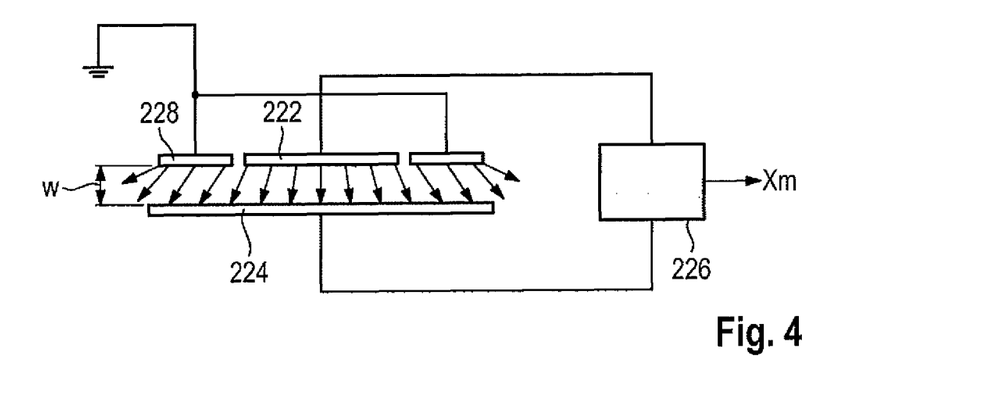
FIG. 4 schematically shows the operative principle of a capacitive sensor.

A first exemplary embodiment is described below, in which the sensors 220 are embodied as capacitive sensors. FIG. 4 schematically shows the operative principle of a capacitive sensor 220. Such a capacitive sensor 220 comprises measurement electrodes 222 and 224, which are arranged at the distance w from one another. The measurement electrodes 222 and 224 are connected to a capacitance measuring device 226, which generates a measurement signal Xm dependent on the capacitance of the measurement electrodes 222 and 224. The capacitance of the measurement electrodes 222 and 224 is crucially dependent on the distance between the measurement electrodes 222 and 224, which can be arranged on joining surfaces 212 situated opposite one another. Therefore, if the width d of the interspace changes and thus the distance between the measurement electrodes 222 and 224 also changes, then this can be detected by the change in the electrically measurable capacitance via the measurement signal Xm. A shielding electrode 228 connected to a specific reference potential can optionally be arranged around the measurement electrode 222, the shielding electrode shielding the inhomogeneous marginal region of the electric field. As a result, an approximately parallel electric field arises between the measurement electrodes 222 and 224. Consequently, even small changes in capacitance can be detected.

As already mentioned, the measurement electrodes 222 and 224 can each be arranged on opposite joining surfaces 212. The measurement electrodes 222 and 224 can be rectangular, for example, and can have a size of e.g. approximately 2 to approximately 15 mm by approximately 2 to approximately 15 mm. With one pair of measurement electrodes 222, 224 it is possible to detect the relative position of two mirror segments 210 with respect to one translational degree of freedom. Two pairs of measurement electrodes 222, 224 can be provided for detecting the relative position of two mirror segments 210 with respect to one rotational degree of freedom.

The measurement electrodes 222, 224 can be produced from thin metal strips, e.g. composed of copper or the like. The lines connecting the measurement electrodes 222, 224 to the capacitance measuring device 226 can be led along the joining surfaces 212. As an alternative thereto, they can also be led in grooves provided through the joining surfaces 212, or through the mirror segments 210. It is also correspondingly possible to arrange the measurement electrodes 222, 224 in cutouts provided in the joining surfaces 212. This is illustrated schematically in FIGS. 5A and 5B, which each show a cross section through a mirror segment 210. In the variant illustrated in FIG. 5A, an undercut is provided in the joining surface 212, the measurement electrode 222 or 224 being arranged in the undercut. In the variant illustrated in FIG. 5B, a cutout is provided in the joining surface 212, the measurement electrode 222 or 224 being arranged in the cutout. Consequently, the measurement electrode 222 and 224, respectively, do not project into the gap between the joining surfaces 212, and so the mirror segments can be positioned even closer to one another. If the undercut or the cutout is provided along the entire joining surface 212, the lines for driving the measurement electrodes 222, 224 can also be provided therein.

Figure 5A:
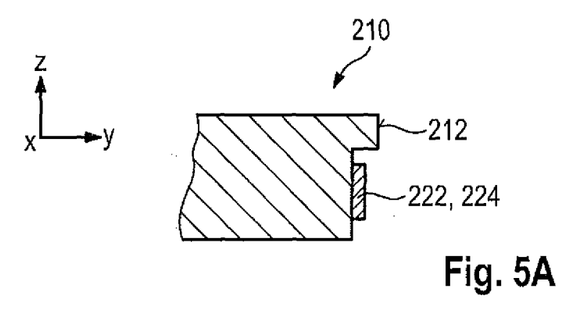
FIGS. 5A and 5B show a cross section through the zy plane through one mirror segment.
Figure 5B:
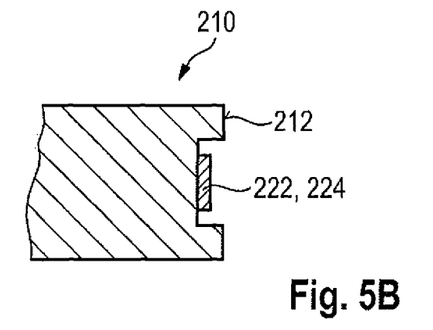

On the basis of the measurement principle illustrated in FIG. 4, changes in position with respect to the y-direction or rotations about the z- or y-axis can be detected with the sensor arrangements illustrated in FIG. 3 and in FIGS. 5A and 5B. However, via corresponding configuration of the interspace 214 and arrangement of the measurement electrodes 222, 224 therein, it is possible also to detect changes in position with respect to other degrees of freedom. This is illustrated schematically in FIG. 6, which shows a cross section through the zy plane through two adjacent mirror segments 210. In the case of the mirror segments 210 illustrated in FIG. 6, the joining surfaces 212 have a substantially Z-shaped cross section in the region of the measurement electrodes 222, 224, such that an upper or lower part of the mirror segment 210 projects into the interspace 214. In this case, a section of the joining surfaces 212 respectively extends in the y-direction, that is to say in the direction transversely with respect to the interspace 214, and the measurement electrodes 222 and 224 are arranged on the sections. Consequently, in the case of a relative displacement of the mirror segments 210 in the z-direction, the capacitance provided by the measurement electrodes 222 and 224 changes, such that the relative position of the mirror segments 210 with respect to the z-direction can be detected. The mirror segments 210 illustrated in FIG. 6 correspond to the mirror segments 210-1 and 210-2 or to the mirror segments 210-3 and 210-4 in FIG. 3.

The use of capacitive sensors as sensors 220 as explained above has the advantage that the sensors 220 can be made very flat, that is to say require hardly any space in the interspace 214. Accordingly, the mirror segments 210 can be brought close together. Furthermore, capacitive sensors are well suited to use in a high vacuum, that is to say are suitable for vacuum. Furthermore, capacitive sensors can be driven from outside the evacuated region of the lithography apparatus 100, such that no heat arises, or heat arises only slightly, in the evacuated region. However, they can represent a challenge insofar as the change in capacitance of the measurement electrodes 222, 224 is proportional to 1/w (inverse of the distance w between the measurement electrodes) and is therefore highly nonlinear particularly in the case of small gap widths. In this respect, the provision of a specific minimum distance between the measurement electrodes 222 and 224 by recessing in the joining surfaces, as illustrated in FIGS. 5A and 5B, can be advantageous in order to achieve a more or less linear operating range.

In a lithography apparatus in accordance with a second exemplary embodiment, pressure sensors are used instead of the capacitive sensors described above. The general construction of the lithography apparatus of this second exemplary embodiment corresponds to the construction illustrated in FIG. 1 and will therefore not be explained again. The pressure sensors used in the lithography apparatus of the second exemplary embodiment will be explained with reference to FIGS. 7 to 11. In this case, elements which are identical or functionally identical to elements of the figures described above are identified by identical reference signs, and are not explained in greater detail. The same also applies to the following embodiments and figures.

Figure 7:
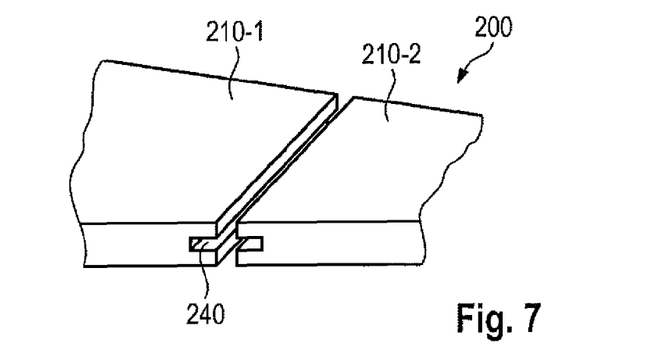
FIG. 7 shows a perspective illustration of two mirror segments in accordance with a second exemplary embodiment.
Figure 8:
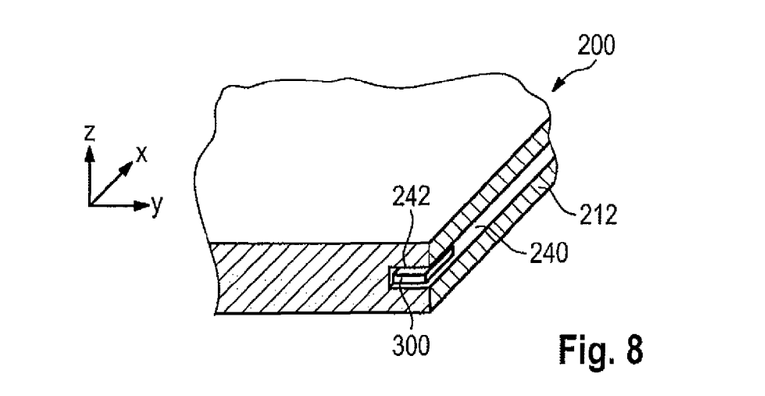
FIG. 8 shows a sectional illustration through a mirror segment and the arrangement of a pressure sensor in a sensor channel.
Figure 9:
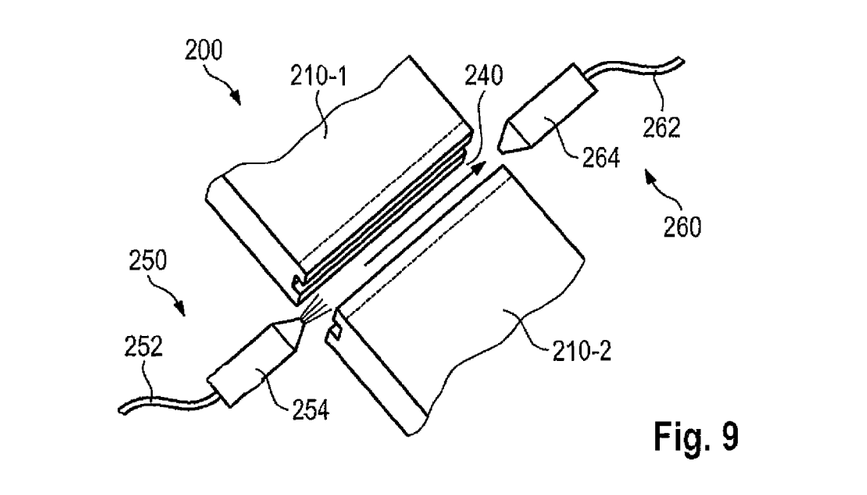
FIG. 9 is a schematic illustration of an arrangement for introducing a gas into the sensor channel.

FIG. 7 shows a perspective illustration of two mirror segments 210-1 and 210-2 in accordance with a second exemplary embodiment. FIG. 8 shows a sectional illustration through the mirror segment 210-1 and also the arrangement of a pressure sensor 300 in a sensor channel 240. FIG. 9 is a schematic illustration of an arrangement for introducing a gas into the sensor channel 240.

As illustrated in FIGS. 7 to 9, in the adjacent mirror segments 210-1 and 210-2 of this embodiment, a groove 242 is respectively provided in the joining surface 212, which extends approximately centrally along the entire joining surface 212. The groove 242 can be produced for example by milling using a diamond milling unit or the like. The two opposite grooves 242 together form a sensor channel 240. As viewed in cross section, therefore, the interspace 214 in this exemplary embodiment has the shape of a plus sign (+), with relatively narrow gaps at the top side and the underside of the mirror arrangement 200 and a widened sensor channel 240 therebetween.

The pressure sensor 300 is arranged in the sensor channel 240. To put it more precisely, the pressure sensor 300 can be arranged in one of the two opposite grooves 242. Furthermore, a gas supply device 250 and a gas extraction device 260 are respectively provided at the two ends of the sensor channel 240. The gas supply device 250 comprises a gas feeding tube 252, which is connected to a gas reservoir arranged outside the vacuum chamber, and also a gas nozzle 254. The gas extraction device 260 comprises a gas discharging tube 262, which is connected to the gas reservoir, and also a gas suction connector 264. Via a pump (not illustrated in greater detail), a gas is pumped from the gas reservoir through the gas feeding tube 252 to the gas nozzle 254 and sprayed from the gas nozzle 254 with a predetermined pressure into the sensor channel 240. The gas is extracted from the sensor channel 240 via the gas suction connector 264 arranged at the opposite end of the sensor channel 240, and is led to the gas reservoir again via the gas discharging tube 262.

The gas used can be an inert gas, such as e.g. nitrogen or helium or the like. However, it is also possible to use air. It goes without saying that it is also possible to use a gas source connected to the gas feeding tube 252 and a gas sink connected to the gas discharging tube 262, instead of just one gas reservoir.

The pressure in the sensor channel 240 is dependent firstly on the flow rate of the gas supplied and secondly on the cross-sectional area of the sensor channel 240. The cross-sectional area of the sensor channel 240 changes linearly with the distance between the mirror segments 210. The pressure sensor 300 generates a sensor signal containing information about the gas pressure in the sensor channel 240. Since the flow rate of the gas is known, the distance between the mirror segments 210 can thus be deduced from the sensor signal. In other words, the pressure sensor 300 serves here as a position sensor that detects the relative position of the mirror segments 210 with respect to the y-direction. By contrast, the pressure sensor 300 is not sensitive, or only very slightly sensitive, with respect to the relative position of the mirror segments 210 with respect to the x-direction and the z-direction, since changes in position in these directions do not lead to a change in the cross-sectional area of the sensor channel 240.

With the above-described arrangement in accordance with the second exemplary embodiment, the distance between the mirror segments 210 can be detected with the aid of a pressure sensor 300. In the case of this arrangement, the measurement variable, namely the pressure in the sensor channel 240, changes substantially linearly with the relative position to be detected of the mirror segments 210 in the y-direction. Consequently, it is possible to achieve a good linearity of the measurement signal over a larger measurement range than with capacitive sensors, for example.

Figure 6:
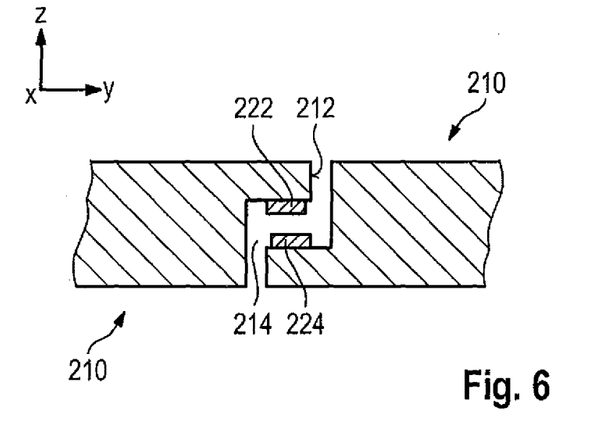
FIG. 6 shows a cross section through the zy plane through two adjacent mirror segments.

The relative position of the mirror segments 210 in the y-direction can be detected with the arrangement described above. However, via corresponding configuration of the sensor channel, it is possible also to detect the relative position of the mirror segments 210 with respect to other degrees of freedom. Thus, by way of example, the interspace 214 between the mirror segments 210 can be configured as illustrated in FIG. 6, and, instead of the measurement electrodes 222 and 224, a pressure sensor 300 can be arranged in the central region between the mirror segments 210, which in this case serves as a sensor channel. A change in the relative position of the mirror segments 210 in the z-direction thus leads to a change in the cross-sectional area of the sensor channel, such that the pressure in the sensor channel changes. Such an arrangement thus makes it possible to detect the relative position of the mirror segments 210 in the z-direction.

Via a corresponding configuration of the sensor channel and arrangement of a corresponding number of pressure sensors, it is thus possible to detect the relative position of the mirror segments 210 with respect to all six degrees of freedom.

In this case, it is also possible to provide a plurality of channels per segment pair, wherein at least one pressure sensor is arranged in each channel, and the individual sensors respond to positional displacements of the mirror segments 210 in different spatial directions.

In one alternative configuration, it is also possible for just one gas inlet to be arranged in the center of the mirror, which conducts the gas into the various channels arranged in a star-shaped manner. In this case, the gas is conducted along the channels toward the outside and taken up there by the gas suction connectors.

In accordance with the second embodiment described above, exactly one pressure sensor 300 is arranged in the sensor channel 240. However, it is also possible to arrange a plurality (e.g. two or four or more) of pressure sensors 300 along the sensor channel 240. A more precise measurement value can thus be determined by averaging the sensor signals generated. Furthermore, it is also possible, via a corresponding evaluation, to detect rotations about the z-axis or the like with such an arrangement.

Furthermore, it is not necessary to provide the grooves 242 at both opposite joining surfaces 212, and it suffices to provide one sensor channel 240, through which gas flows and in which the pressure sensor 300 is arranged.

A so-called "leaky seal" can be used as sealing for the interspace. In this case, the free path length of the gas admitted into the channel is chosen with respect to the narrowest gap of the joint such that the gas cannot emerge, or can emerge only to a very small extent, through this narrow gap.

Figure 10:
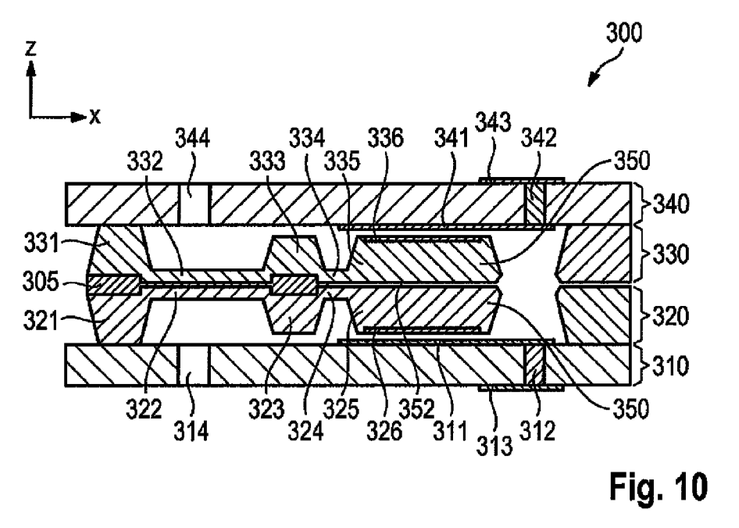
FIG. 10 shows a cross-sectional view through the pressure sensor.
Figure 11:
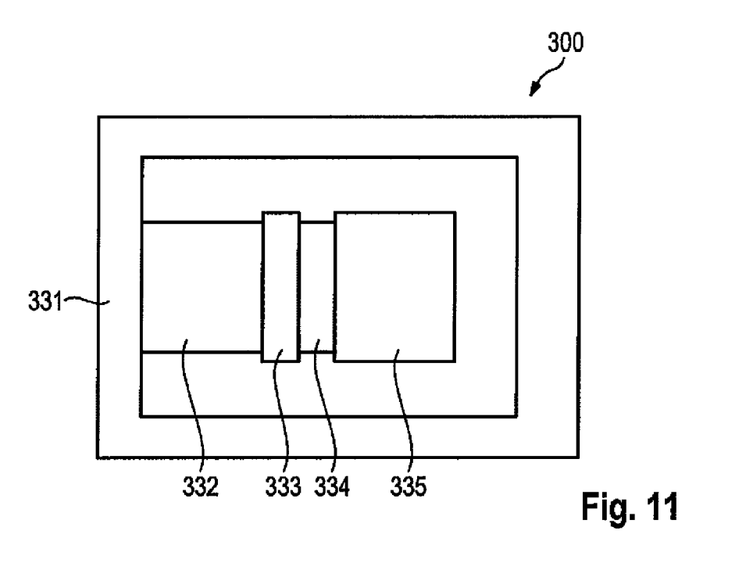
FIG. 11 shows a plan view of the pressure sensor, wherein an upper cover plate of the pressure sensor has been removed for illustrative reasons.

The pressure sensor 300 has to be small enough to be able to be arranged in the interspace 214 or in the sensor channel 240. One possible embodiment of such a pressure sensor 300 is illustrated below with reference to FIGS. 10 and 11. FIG. 10 shows a cross-sectional view through the pressure sensor 300. FIG. 11 shows a plan view of the pressure sensor 300, wherein an upper cover plate of the pressure sensor 300 has been removed for illustrative reasons.

The pressure sensor 300 has a four-layered construction and comprises, from the bottom to the top, a lower cover plate 310, a lower chip plane 320, an upper chip plane 330 and an upper cover plate 340. The cover plates 310 and 340 can be produced from glass or from silicon, for example, and serve as carrier elements for the chip planes 320 and 330 arranged therebetween.

The chip planes 320 and 330 are in each case produced monolithically from silicon or a comparable semiconductor material, or else from quartz or the like. The chip planes 320 and 330 in each case have a circumferential chip frame 321 and 331, respectively, a first spring element 322 and 332, respectively, a base element 323 and 333, respectively, a second spring element 324 and 334, respectively, and a vibrating element 325 and 335, respectively. The chip planes 320 and 330 will be explained by way of example on the basis of the chip plane 330. The construction of the chip plane 320 corresponds to that of the chip plane 330. FIG. 11 shows a plan view of the chip plane 330, that is to say shows the pressure sensor 300 with the cover plate 310 removed. As shown in FIG. 11, the chip frame 331 has the form of a circumferential rectangular frame and is fixed to the underside of the upper cover plate 340.

The first spring element 332 extends from a shorter side of the chip frame 331, the spring element having a smaller height than the chip frame 331. The base element 333 is adjacent to the first spring element 332, the base element being connected to the vibrating element 335 via the second spring element 334. The second spring element 334, too, has a smaller height than the chip frame 331, the base element 333 and the vibrating element 335. A thermal oxide 305 is provided between the chip frames 321 and 331, the first springs 322 and 332, and the base elements 323 and 333, the thermal oxide serving as insulation between the two chip planes 320 and 330.

The first spring elements 322 and 332 serve as vibrating springs which only allow vibrations in the z-direction. They therefore serve for the vibration decoupling of the base elements 323 and 333 relative to the chip frames 321, 331. This makes the pressure sensor 300 less sensitive to external vibrations and the like. The vibrating elements 325 and 335 are in turn fixed to the base elements 323 and 333 in a freely vibrating manner via the second spring elements 324, 334. The vibrating elements 325 and 335 together with the second spring elements 324, 334 and the base elements 323 and 333 form a tuning fork 350. A vibration gap 352 is formed between the vibrating elements 325 and 335 of the tuning fork 350, the width of which can be 2 to 3 micrometers, for example.

On the inner sides of the cover plates 310, 340, provision is made of first electrodes 311 and 341, respectively, wherein the first electrodes 311 and 341, respectively, are arranged opposite the vibrating elements 325 and 335, respectively. The electrodes 311 and 341, respectively, are connected to a sensor controller (not illustrated in greater detail) via plated-through holes 312 and 342, provided in the cover plates 310 and 340, via conduction elements 313 and 343 on the outer side of the cover plates 310 and 340. Second electrodes 326 and 336 are provided on those sides of the vibrating elements 325 and 335 which face the cover plates 310, 340, which second electrodes can be connected to a predetermined potential. The electrodes 311, 326, 336, 341 can be produced from a thin metal layer, e.g. composed of aluminum. The first electrodes 311 and 341, respectively, serve two purposes, namely the excitation of vibrations of the vibrating elements 325 and 335 and the detection of the vibration state thereof.

The cover plates 310 and 340 together with the chip frames 321 and 331 form a housing, in the interior of which the tuning fork 350 is arranged. The interior of the housing is connected to the environment of the pressure sensor 300 via through-holes 314 and 344, with the result that substantially the same pressure prevails within and outside the housing.

The sensor principle of the pressure sensor 300 is outlined below. Via a suitable AC voltage being applied to the first electrodes 311 and 341, the tuning fork 350 is excited to effect continuous vibrations having a constant amplitude (of e.g. a few nm) at its mechanical natural frequency. In this case, the vibrating elements 325 and 335 move in opposite directions along the z-axis. The vibration gap 352 therefore becomes periodically wider and narrower. When the vibrating elements 325 and 335 move toward one another, part of the gas escapes from the vibration gap 352 and produces friction losses. That part of the gas which remains in the vibration gap 352 is compressed and acts as an additional spring (so-called "squeeze effect"). Both the friction losses and the spring effect on account of the gas have a great dependence on pressure, in particular also at low pressures as far as the vacuum range, and so the arrangement described is suitable as a pressure sensor. The natural frequency of the tuning fork 350 and the pressure dependence of the damping can be set via a suitable dimensioning of the vibrating elements 325, 335 and of the spring elements 324 and 334.

The drive force which is required for the excitation of the tuning fork 350 and which corresponds to the amplitude of the drive voltage is proportional to the damping of the vibration of the tuning fork 350. In pressure ranges in which the damping depends predominantly on the ambient pressure, the amplitude of the drive voltage is thus a sensitive measure of the pressure. The first electrodes 311, 341 for exciting the tuning fork 350, together with a suitable evaluation circuit, can thus be used as an arrangement for detecting the pressure-dependent resonant frequency of the tuning fork 350 and/or the vibration amplitude at the resonant frequency. The pressure in the region of the sensor 300, and thus the distance between the mirror segments 210 can then be deduced from the detected resonant frequency and/or vibration amplitude.

Pressure sensors similar to those described above can also be found in the German patent application DE 100 33 182 A1 and in the postdoctoral thesis "Technologieentwicklung für kapazitive Sensoren mit bewegten Komponenten" ["Technological development for capacitive sensors with moving components"], Dr.-Ing. Karla Hiller, T U Chemnitz, 2004, in particular Chapter 4 therein. With regard to further technical details, therefore, reference is made to these documents.

The pressure sensor 300 described here is very sensitive even at low pressures, with the result that it suffices to admit a comparatively small amount of gas into the sensor channel 240 and extract it. It can thus be ensured that no, or only a slight amount of gas escapes into the vacuum region in which the mirror arrangement 200 is arranged. Furthermore, the pressure sensor 300 can be made very flat, with a total height of approximately 300 to 400 μm. This makes it possible to design the sensor channel 240 to be very narrow, such that even slight changes in the width of the interspace 214 lead to comparatively large pressure changes in the sensor channel 240. Consequently, a high sensor sensitivity can be achieved. It is also conceivable for the interspace 214 not to have a sensor channel 240, and for the pressure sensors 300 to be provided areally on the joining surfaces 212, cf. FIG. 2.

The sensor signals generated by the sensors 220 and 300 can be fed to a control device (not illustrated in greater detail). On the basis of the sensor signals, the control device determines actuator signals which are fed to the abovementioned actuators and which guide the individual mirror segments 210 in each case into their desired position and orientation in which the mirror segments 210 lie flush alongside one another and the surface deviation is minimal, that is to say for example not greater than 20 nm. In this case, the individual mirror segments 210 can be actuated independently of one another, to be precise with respect to all six degrees of freedom. In the case of four mirror segments 210, therefore, 24 actuators can be provided, for example. The exemplary embodiments described above therefore provide regulating arrangements for regulating the relative position of the mirror segments 210 with respect to all degrees of freedom. In this case, the mirror segments 210 can initially be adjusted upon the start-up of the lithography apparatus 100 or else be readjusted during operation by a control loop.

The actuators can be embodied for example as Lorentz actuators or else as piezo actuators.

It should be noted that the embodiments described above are merely by way of example and can be varied in diverse ways in the context of the scope of protection of the patent claims. In particular, the features of the embodiments described above can also be combined with one another.

Furthermore, various configurations for mirror arrangements have been explained on the basis of the mirror arrangement 200 of the lithography apparatus 100. However, the configurations illustrated can, of course, also be applied to any other mirror of the lithography apparatus 100.

Furthermore, exemplary embodiments of a mirror arrangement in an EUV lithography apparatus have been explained. However, the invention is not restricted to EUV lithography apparatuses, but rather can also be applied to other lithography apparatuses.

Furthermore, the mirror arrangement is not restricted to four mirror segments, and it is also possible to provide fewer than four (that is to say two or three mirror segments) or more than four mirror segments.

LIST OF REFERENCE SIGNS

100 EUV lithography apparatus
102 Beam shaping system
104 Illumination system
106 Projection system
108 EUV light source
110 Collimator
112 Monochromator
114 EUV radiation
116 First mirror
118 Second mirror
120 Photomask
122 Wafer
124 Third mirror
126 Fourth mirror
200 Mirror arrangement
210-1 . . . 210-4 Mirror segments
212 Joining surfaces
214 Interspace
220 Sensors
222, 224 Measurement electrodes
226 Capacitance measuring device
228 Shielding electrode
240 Sensor channel
242 Groove
250 Gas supply device
252 Gas feeding tube
254 Gas nozzle
260 Gas extraction device
262 Gas discharging tube
264 Gas suction connector
300 Pressure sensor
305 Thermal oxide
310 Lower cover plate
311, 341 First electrodes
312, 342 Plated-through holes
313, 343 Conduction elements
320 Lower chip plane
321, 331 Chip frames
322, 332 First spring elements
323, 333 Base elements
324, 334 Second spring elements
325, 335 Vibrating elements
326, 336 Second electrodes
330 Upper chip plane
340 Upper cover plate
350 Tuning fork
352 Vibration gap

The invention claimed is:

1. An apparatus, comprising:
   a mirror comprising first and second mirror segments joined together to define an interspace between the first and second mirror segments; and
   a sensor configured to detect a relative position of the first and second mirror segments,
   wherein the sensor is in the interspace between the first and second mirror segments, and the apparatus is a lithography apparatus, and
   wherein the interspace is configured so that a relative movement of the first and second mirror segments results in a pressure change in the interspace, and the sensor comprises a pressure sensor configured to generate a sensor signal dependent on the pressure in the interspace.

2. The apparatus of claim 1, wherein each of the first and second mirror segments has a joining surface along which the first and second mirror segments are joined together, and the sensor is in a cutout defined by at least one of the joining surfaces.

3. The apparatus of claim 1, further comprising a sensor controller configured to drive the sensor and/or to evaluate a sensor signal.

4. The apparatus of claim 3, wherein the apparatus is configured to wirelessly transmit signals at least in sections between the sensor controller and the sensor.

5. The apparatus of claim 1, further comprising:
   a gas supply device configured to supply a gas into the interspace; and
   a gas removal device configured to remove the gas from the interspace.

6. The apparatus of claim 1, wherein the pressure sensor comprises:
   a tuning fork comprising two vibration elements configured to vibrate via excitation, a parameter of the tuning fork being dependent on the pressure in the interspace, and
   an arrangement configured to detect the parameter of the tuning fork,
   wherein the parameter of the tuning fork comprises at least one parameter selected from the group consisting of a resonant frequency of the tuning fork and a vibration amplitude of the tuning fork at the resonant frequency of the tuning fork.

7. The apparatus of claim 6, wherein the two vibrating elements comprise a material selected from the group consisting of structured semiconductor material and quartz.

8. The apparatus of claim 6, wherein the pressure sensor further comprises electrodes, and the electrodes are configured to: a) excite the vibrating elements to vibrate; and/or b) detect the parameter of the tuning fork.

9. The apparatus of claim 1, wherein the interspace is a gap between the first and second mirror segments.

10. The apparatus of claim 1, wherein the interspace comprises a channel, and the sensor is arranged in the channel.

11. The apparatus of claim 10, wherein the channel is defined by a groove in at least one joining surface of one of the first and second mirror segments.

12. The apparatus of claim 11, wherein the groove extends along an entire length of the at least one joining surface.

13. The apparatus of claim 1, wherein the sensor is configured to be used in a vacuum.

14. The apparatus of claim 1, comprising a plurality of sensors configured to detect the relative position of the first and second mirror segments with respect to a plurality of degrees of freedom, wherein the plurality of sensors are in the interspace.

15. The apparatus of claim 1, comprising a plurality of sensors configured to detect the relative position of the first and second mirror segments with respect to three translational degrees of freedom and three rotational degrees of freedom, wherein the plurality of sensors are in the interspace.

16. The apparatus of claim 1, further comprising first and second actuators, wherein the first actuator is configured to actuate the first mirror segment, and the second actuator is configured to actuate the second mirror segment.

17. The apparatus of claim 1, wherein the first and second mirror segments do not contact each other.

* * * * *

UNITED STATES PATENT AND TRADEMARK OFFICE
CERTIFICATE OF CORRECTION

PATENT NO. : 9,846,375 B2
APPLICATION NO. : 14/573058
DATED : December 19, 2017
INVENTOR(S) : Joachim Hartjes Page 1 of 1

It is certified that error appears in the above-identified patent and that said Letters Patent is hereby corrected as shown below:

In the Specification

Column 2, Line 44, delete "interferrometric" and insert -- interferometric --.

Column 9, Line 22, delete "l/w" and insert -- 1/w --.

Signed and Sealed this
Tenth Day of April, 2018

Andrei Iancu
*Director of the United States Patent and Trademark Office*